(12) United States Patent
Marnfeldt

(10) Patent No.: US 6,703,674 B1
(45) Date of Patent: Mar. 9, 2004

(54) ELECTRICAL DEVICE

(75) Inventor: Göran Marnfeldt, Valencia, CA (US)

(73) Assignee: Astrazeneca AB, Sodertalje (SE)

( * ) Notice: Subject to any disclaimer, the term of this patent is extended or adjusted under 35 U.S.C. 154(b) by 296 days.

(21) Appl. No.: 09/646,133

(22) PCT Filed: Jun. 6, 2000

(86) PCT No.: PCT/SE00/01164
§ 371 (c)(1),
(2), (4) Date: Sep. 13, 2000

(87) PCT Pub. No.: WO00/75762
PCT Pub. Date: Dec. 14, 2000

(30) Foreign Application Priority Data

Jun. 7, 1999 (SE) ............................................... 9902114

(51) Int. Cl.[7] .......................... H01L 29/84; H02N 1/04; G01R 27/26; H03B 5/30

(52) U.S. Cl. ....................... 257/414; 257/415; 310/370; 324/668; 324/682; 331/154; 331/156; 331/108 C; 331/117 FE; 331/185

(58) Field of Search ............................. 257/225–7, 229, 257/414–415; 310/370; 324/668, 682; 331/154, 156, 108 C, 117 FE, 185

(56) References Cited

U.S. PATENT DOCUMENTS

| 4,494,033 A | | 1/1985 | Morse et al. ............... 310/352 |
|---|---|---|---|
| 4,581,591 A | | 4/1986 | Jacobs, deceased et al. .. 331/96 |
| 5,550,516 A | * | 8/1996 | Burns et al. .................. 331/65 |
| 5,719,073 A | * | 2/1998 | Shaw et al. ................ 437/228 |
| 5,856,765 A | | 1/1999 | Hermann ................ 331/108 C |
| 6,028,343 A | * | 2/2000 | Chan et al. ................. 257/417 |
| 6,040,611 A | * | 3/2000 | De Los Santos et al. ... 257/415 |
| 6,073,484 A | * | 6/2000 | Miller et al. .................. 73/105 |
| 6,124,765 A | * | 9/2000 | Chan et al. ............. 331/116 M |
| 6,278,337 B1 | * | 8/2001 | Chan et al. ............. 331/116 M |

FOREIGN PATENT DOCUMENTS

| EP | 0330104 | 8/1989 | ....................... 9/14 |
|---|---|---|---|
| EP | 0398331 | 11/1990 | ....................... 5/32 |

OTHER PUBLICATIONS

International Search Report PCT/SE 00/01164 N.B.: only search report.

* cited by examiner

Primary Examiner—Minh Loan Tran
Assistant Examiner—Johannes Mondt
(74) Attorney, Agent, or Firm—Fish & Richardson P.C.

(57) ABSTRACT

A clock signal generator in an integrated circuit semiconductor device and a method of generating a clock signal, the clock signal generator comprising: a semiconductor substrate (2); an oscillator unit (4) which comprises at least one support member (10, 12) which is fixed relative to the substrate (2), an oscillator arm (6) which is oscillatably disposed to the at least one support member (10, 12) with regard a reference position, which oscillator arm (6) includes first and second conductive sections (6a, 6b) at positions extended from the at least one support member (10, 12), and at least one biasing element (14, 16) for biasing the oscillator arm (6) towards the reference position; a driver (18) which is disposed at the substrate (2) in spaced relation adjacent one of the conductive sections (6a) of the oscillator arm (6), which driver (18) is configured in use to drive the one of the conductive sections (6a) of the oscillator arm (6) towards or away therefrom when an electrical signal is applied thereto; a sensor (20) which is disposed at the substrate (2) in spaced relation adjacent the other of the conductive sections (6b) of the oscillator arm (6), which sensor (20) is configured in use to generate an electrical signal dependent upon the spacing of the other of the conductive sections (6b) of the oscillator arm (6) therefrom; loop circuitry (28) which in use receives the variable electrical signal generated by the sensor (20) and in response thereto applies an electrical signal to the driver (18) so as to cause oscillation of the oscillator arm (6) at the natural oscillating frequency of the oscillator arm (6); and a clock signal output (36) which is responsive to the variation in the variable electrical signal generated by the sensor (20) so as to provide a clock signal.

20 Claims, 9 Drawing Sheets

ELECTRICAL DEVICE

The present invention relates to a clock signal generator and a method of generating a clock signal.

Many electronic devices utilize clock signals, for example, in synchronisation, time measurement and delay generation. Such clock signals need to be accurate and stable with respect to the supply voltage and temperature. Known clock signal generators commonly use a quartz crystal, but such quartz crystals are relatively bulky and expensive.

It is an aim of the present invention to provide an improved clock signal generator and an improved method of generating a clock signal.

The present invention provides a clock signal generator in an integrated circuit semiconductor device, comprising: a semiconductor substrate; an oscillator unit which comprises at least one support member which is fixed relative to the substrate, an oscillator arm which is oscillatably disposed to the at least one support member with regard to a reference position, which oscillator arm includes first and second conductive sections at positions extended from the at least one support member, and at least one biasing or restoring element for biasing or applying a restoring force to the oscillator arm towards the reference position; a driver which is disposed at the substrate in spaced relation adjacent one of the conductive sections of the oscillator arm, which driver is configured in use to drive the one of the conductive sections of the oscillator arm towards or away therefrom when an electrical signal is applied thereto; a sensor which is disposed at the substrate in spaced relation adjacent the other of the conductive sections of the oscillator arm, which sensor is configured in use to generate an electrical signal dependent upon the spacing of the other of the conductive sections of the oscillator arm therefrom; loop circuitry which in use receives the variable electrical signal generated by the sensor and in response thereto applies an electrical signal to the driver so as to cause oscillation of the oscillator arm at the natural oscillating frequency of the oscillator arm; and a clock signal output which is responsive to the variation in the variable electrical signal generated by the sensor so as to provide a clock signal.

Preferably the sensor comprises a transistor which is configured such that the conductivity thereof is dependent upon the position of the other of the conductive sections of the oscillator arm.

Preferably the transistor is a MOS transistor which together with the other of the conductive sections of the oscillator arm defines a resonant double-gate transistor.

Preferably the oscillator arm oscillates by means of the torsional motion of the biasing element.

Preferably the driver comprises a conductive layer, which is disposed above the substrate, and together with the one of the conductive sections of the oscillator arm defines a capacitor.

Preferably the conductive layer is formed of polysilicon.

Preferably the driver comprises a conductive region in the substrate, which together with the one of the conductive sections of the oscillator arm defines a capacitor.

Preferably one or both of the one and the other of the conductive sections of the oscillator arm is formed of polysilicon, doped crystalline silicon or metal.

Preferably the oscillator arm is formed of polysilicon, metal or doped crystalline silicon.

Preferably the oscillator unit is formed as a single integral unit.

Preferably the oscillator arm is a substantially rigid member.

Preferably the oscillator arm is a generally planar member.

Preferably the oscillator arm comprises an elongate member.

Preferably the conductive sections of the oscillator arm are disposed on opposite sides of the at least one support member.

Preferably one of the one and the other of the conductive sections comprises one end of the oscillator arm.

Preferably the other of the one and the other of the conductive sections comprises the other end of the oscillator arm.

Preferably the loop circuitry includes a signal amplifier.

Preferably the loop circuitry includes a signal phase adjuster.

Preferably the clock signal generator, further comprising a further sensor which is disposed in spaced relation adjacent the one of the conductive sections of the oscillator arm, which further sensor is configured in use to generate an electrical signal dependent upon the spacing of the one of the conductive sections of the oscillator arm therefrom, and a differential circuit which in use receives the variable electrical signals generated by the first and further sensors so as to detect differences in those signals and thereby reduce noise.

The present invention also provides a method of generating a clock signal, comprising the steps of: providing an integrated circuit semiconductor device which comprises an oscillator unit which comprises at least one support member which is fixed relative to a semiconductor substrate, an oscillator arm which is oscillatably disposed to the at least one support member with regard a reference position, which oscillator arm includes first and second conductive sections at positions extended from the at least one support member, and at least one biasing element for biasing the oscillator arm towards the reference position, a driver which is configured to drive one of the conductive sections of the oscillator arm towards or away therefrom when an electrical signal is applied thereto, a sensor which is configured in use to generate an electrical signal dependent upon the spacing of the other of the conductive sections of the oscillator arm therefrom; applying a voltage to the driver to move the one of the conductive sections of the oscillator arm relative thereto; sensing movement of the other of the conductive sections of the oscillator arm using the sensor which generates an electrical signal dependent upon the spacing between the other of the conductive sections of the oscillator arm and the sensor; using the variable electrical signal generated by the sensor to alter the voltage applied to the driver so as to cause oscillation of the oscillator arm at the natural oscillating frequency of the oscillator arm; and forming a clock signal dependent upon the variation in the electrical signal generated by the sensor.

Preferred embodiments of the present invention will now be described hereinbelow by way of example only with reference to the accompanying drawings, in which.

Figure 1:
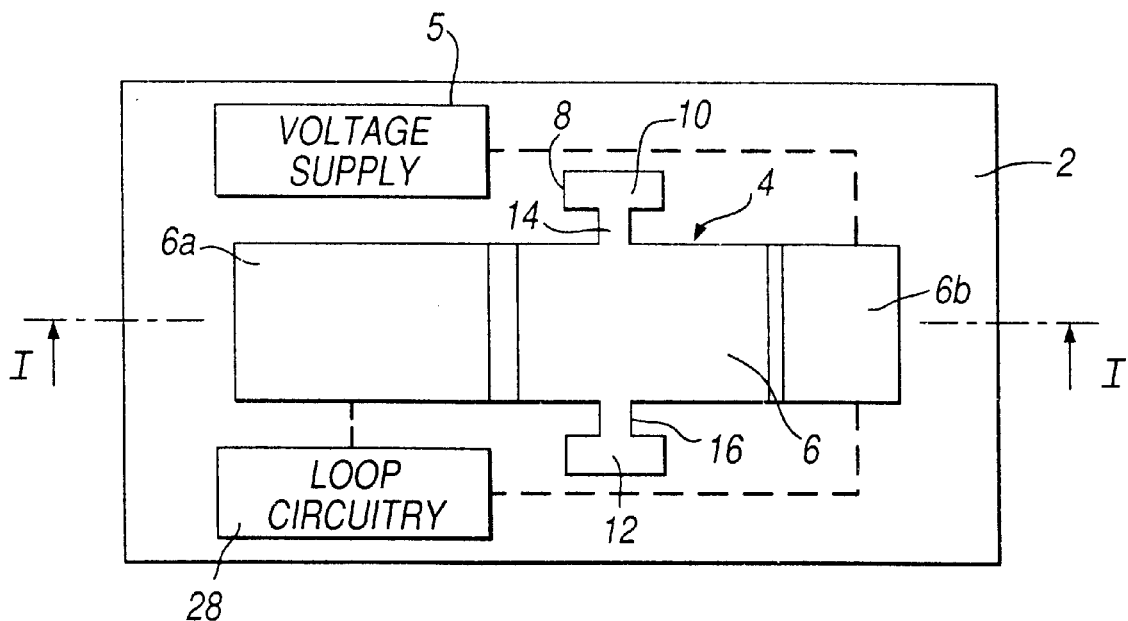
FIG. 1 illustrates a schematic plan view of a clock signal generator in accordance with a first embodiment of the present invention.
Figure 7:
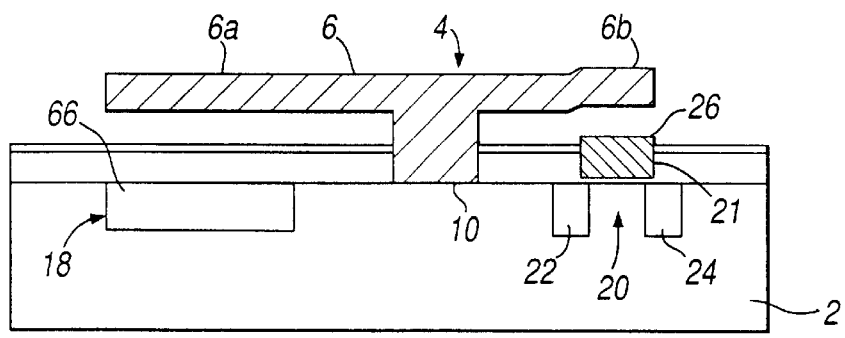
Figure 4A:
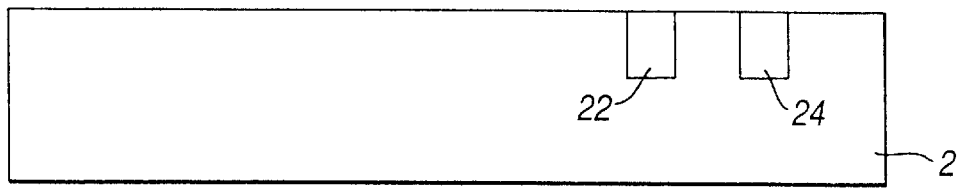
Figure 4B:
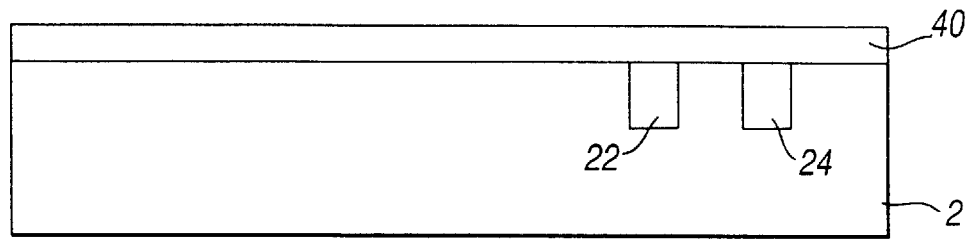
Figure 4C:
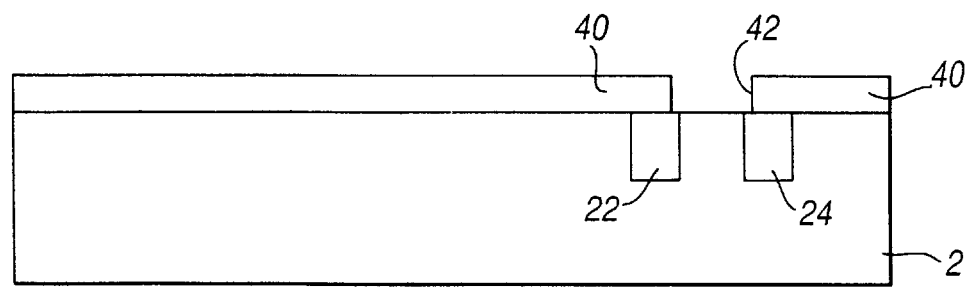
Figure 4D:
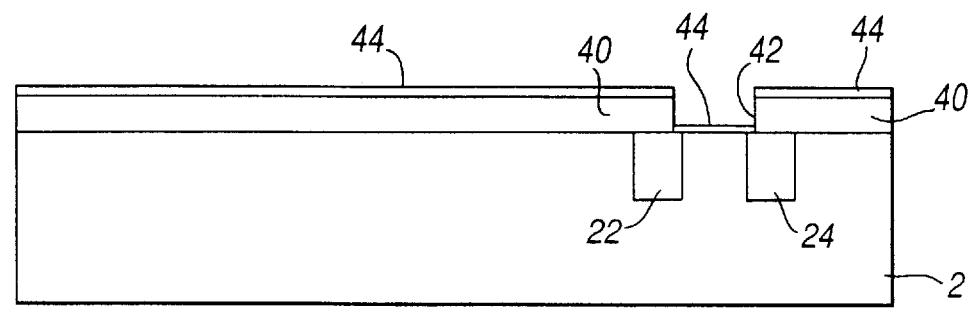
Figure 4E:
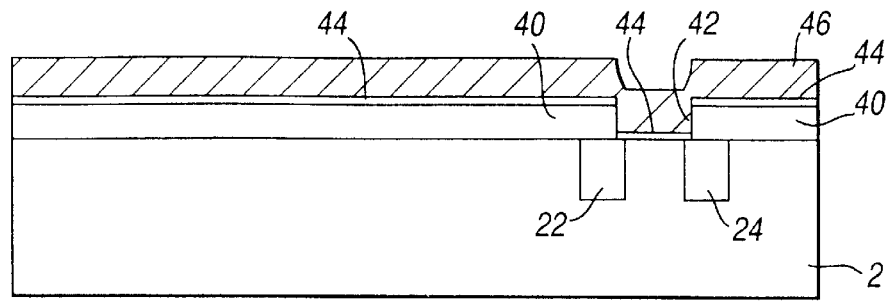
Figure 4F:
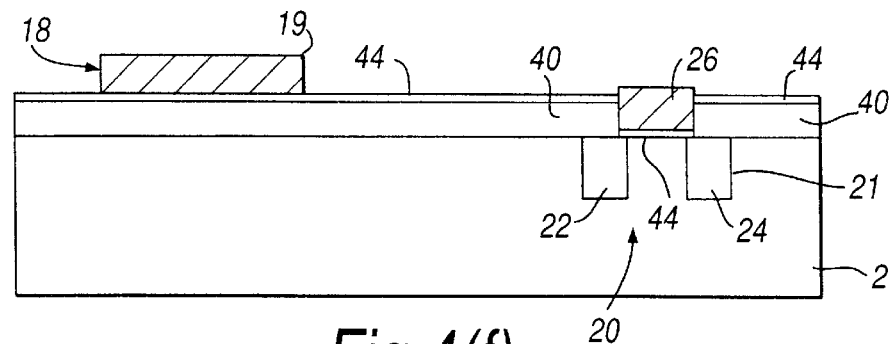
Figure 4G:
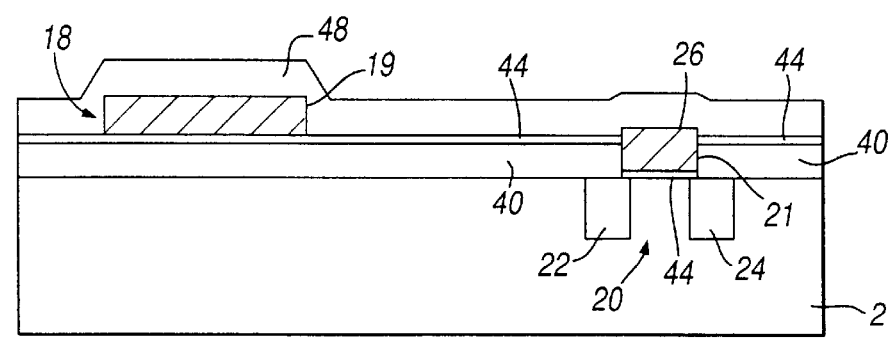
Figure 4H:
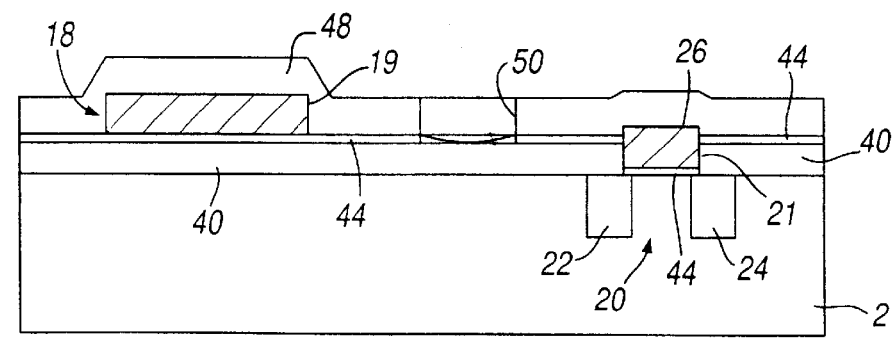
Figure 4I:
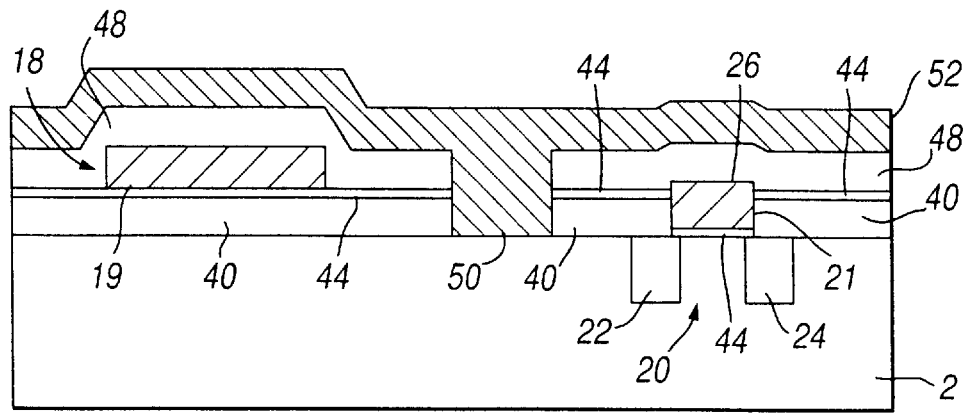
Figure 4J:
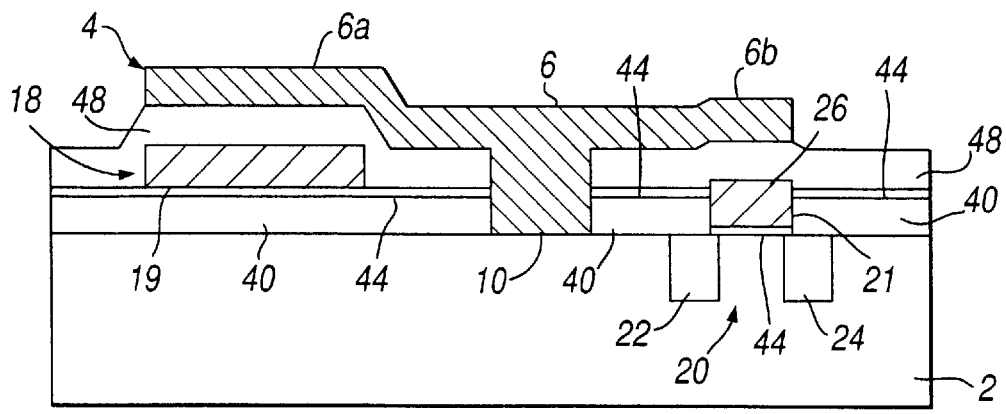
Figure 4K:
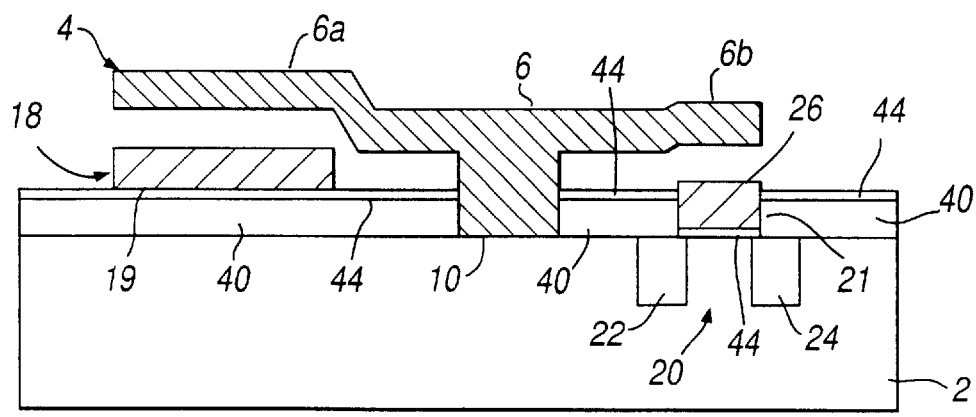
Figure 5:
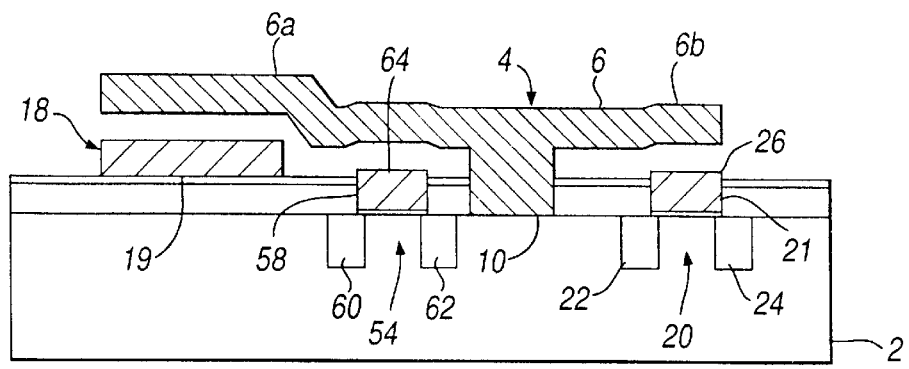
Figure 6:
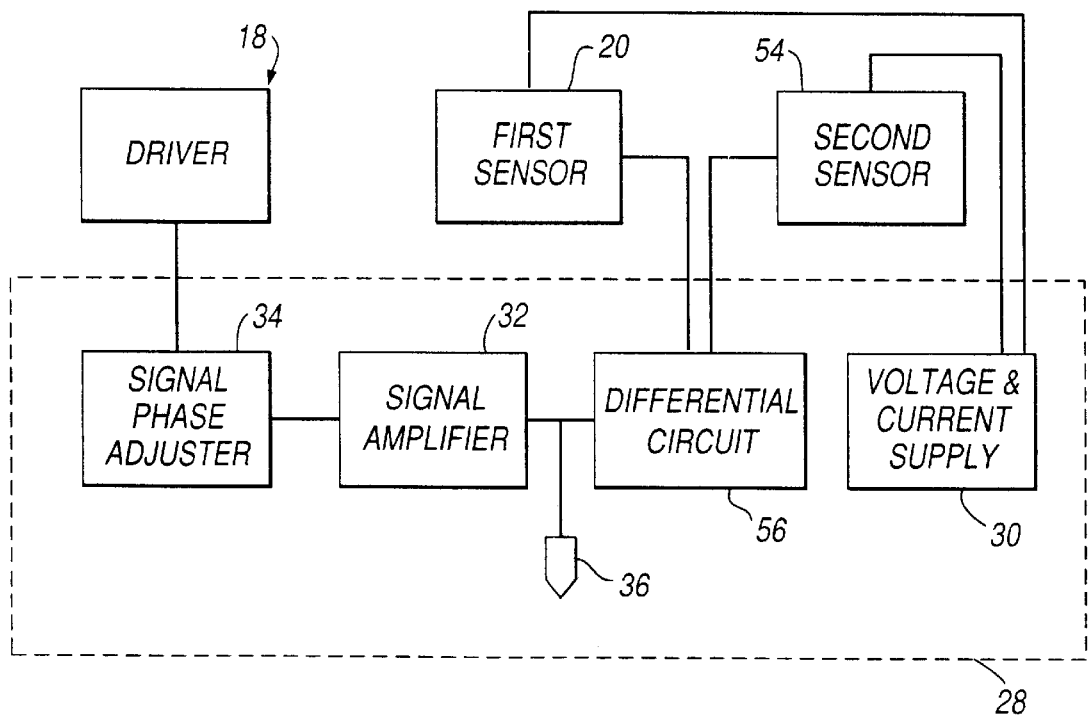
Figure 8A:
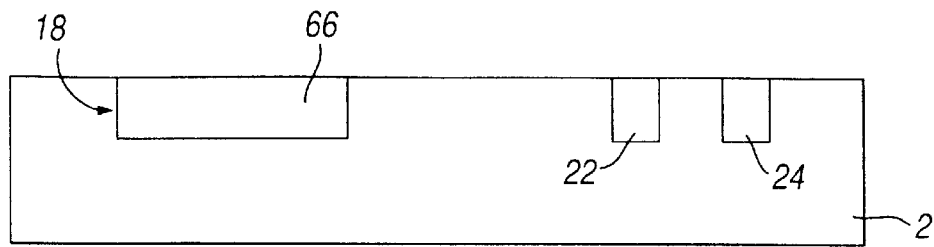
Figure 8B:
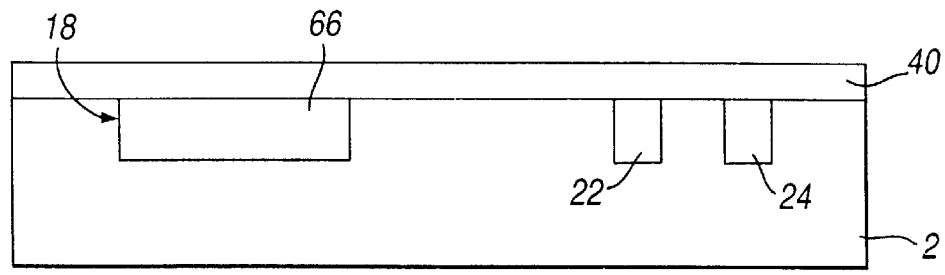
Figure 8C:
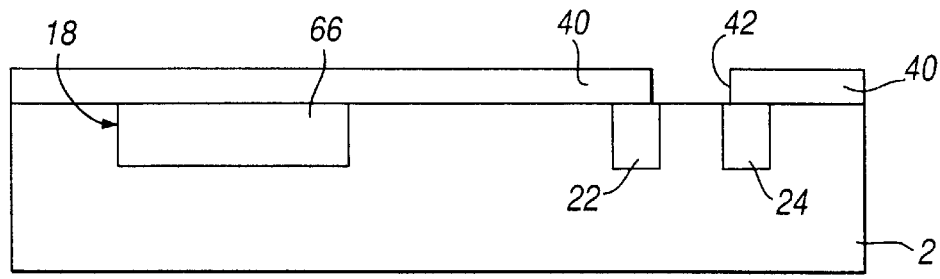
Figure 8D:
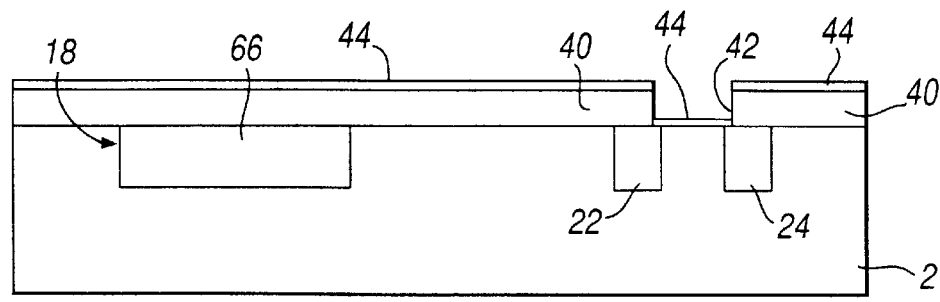
Figure 8E:
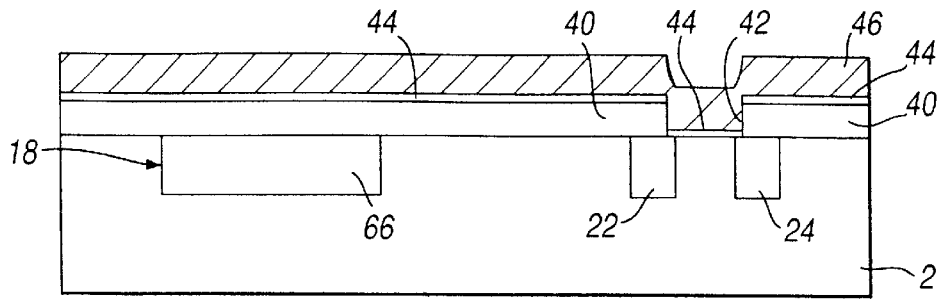
Figure 8F:
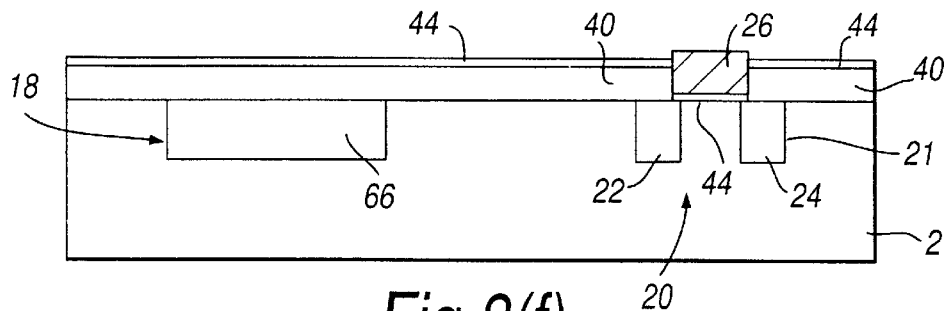
Figure 8G:
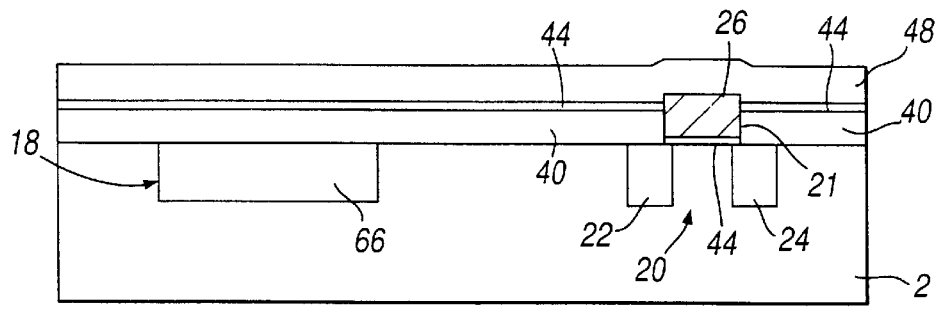
Figure 8H:
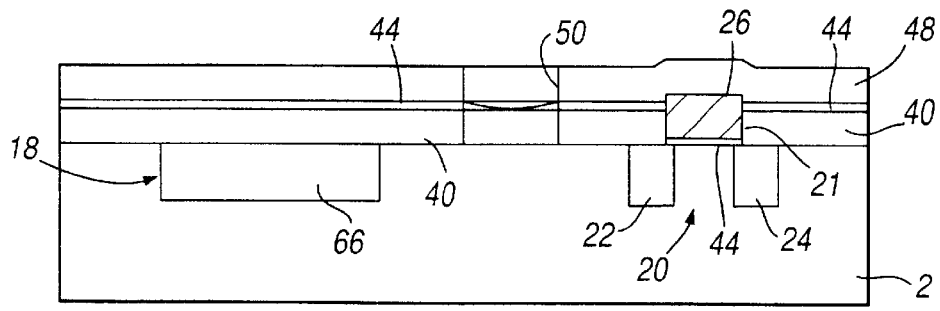
Figure 8I:
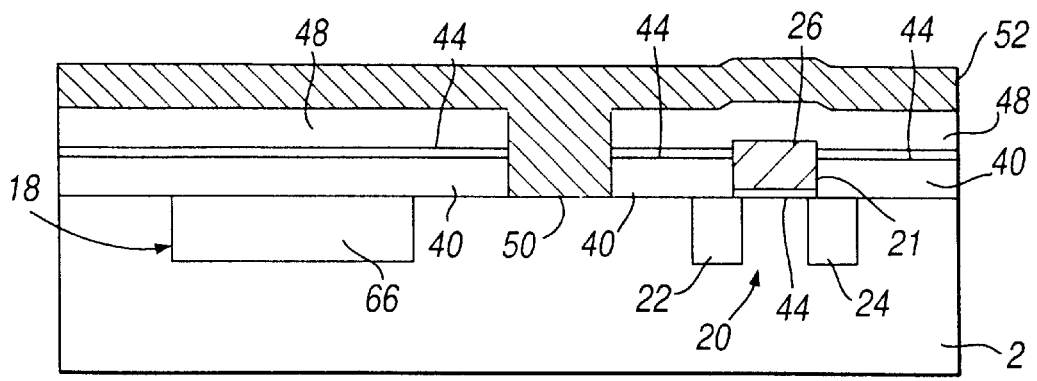
Figure 8J:
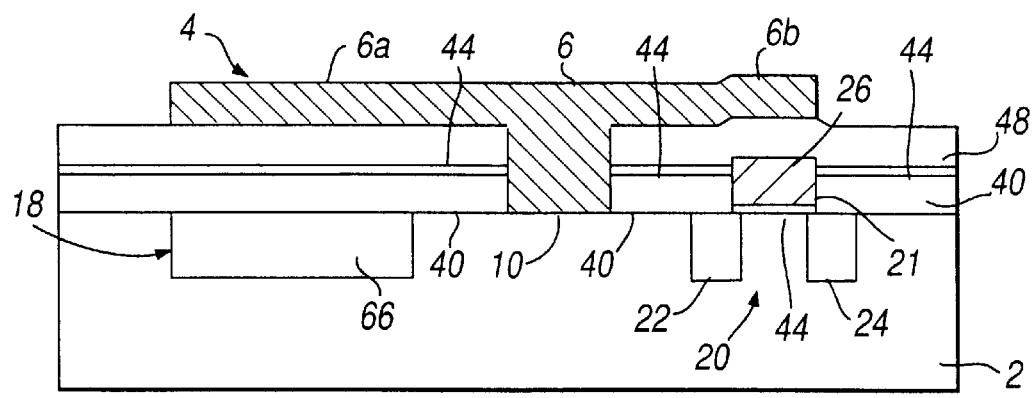
Figure 8K:
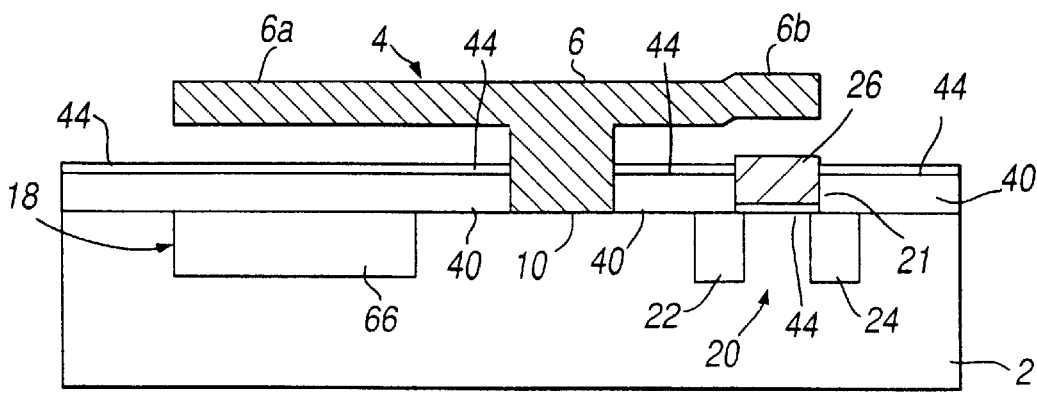

FIGS. 4(a) to (k) illustrate vertical sectional views (along section I—I) of successive steps in the manufacture of the clock signal generator of FIG. 1;

FIG. 5 illustrates a vertical sectional view (along the same section as section I—I in FIG. 1) of a clock signal generator in accordance with a second embodiment of the present invention;

FIG. 6 illustrates a block diagram of the loop circuitry of the clock signal generator of FIG. 5;

FIG. 7 illustrates a vertical sectional view (along the same section as section I—I in FIG. 1) of a clock signal generator in accordance with a third embodiment of the present FIGS. 8(a) to (k) illustrate vertical sectional views (along the same section as section I—I in FIG. 1) of successive steps in the manufacture of the clock signal generator of FIG. 7.

Figure 2:
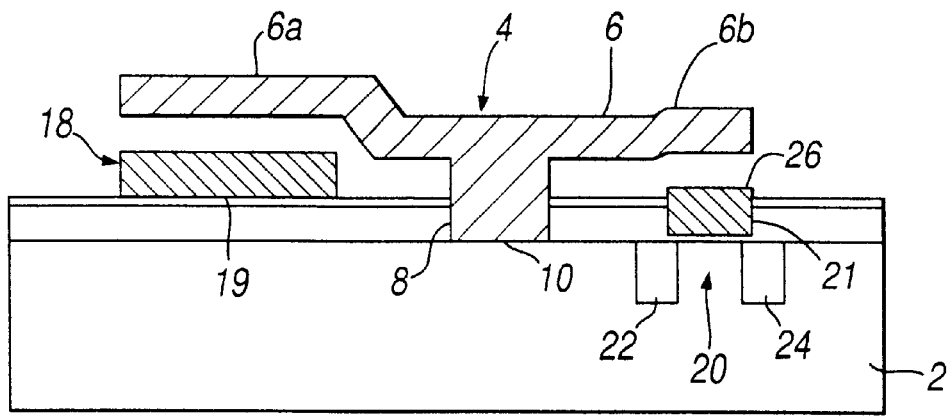
FIG. 2 illustrates a vertical sectional view (along section I—I) of the clock signal generator of FIG. 1.
Figure 3:
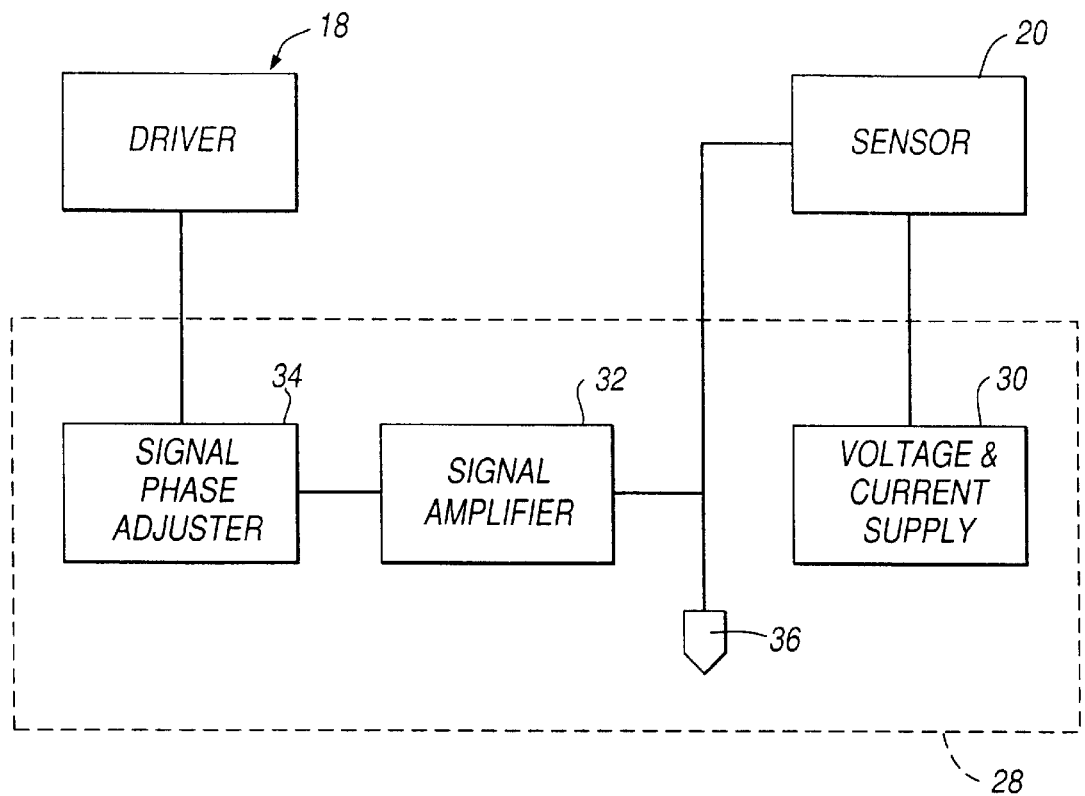
FIG. 3 illustrates a block diagram of the loop circuitry of the clock signal generator of FIG. 1.

FIGS. 1 and 2 illustrate a clock signal generator in accordance with a first embodiment of the present invention. The clock signal generator is an integrated circuit semiconductor device, which, as will be described hereinbelow, is manufactured by techniques well known in the manufacture of semiconductor chip devices.

The clock signal generator comprises a substrate 2, in this embodiment of silicon, an oscillator unit 4 which is disposed to the upper surface of the substrate 2 and a constant voltage supply 5.

The oscillator unit 4 comprises a substantially rigid oscillator arm 6, in this embodiment a generally planar elongate member, which is disposed so as to overlie, in spaced relation, the upper surface of the substrate 2 and a mounting 8 which couples the oscillator arm 6 to the substrate 2 so as to be oscillatably disposed thereto. The oscillator arm 6 is formed of a conductive material, preferably one of metal, polysilicon or doped crystalline silicon. The mounting 8 comprises first and second support members 10, 12 which are disposed on opposed sides of the oscillator arm 6 and extend upwardly from the substrate 2 and first and second interconnecting members 14, 16 which interconnect a substantially central part of the oscillator arm 6 to the respective support members 10, 12 and define an axis of oscillation. In this embodiment the oscillator unit 4 is formed as a single integral unit and the interconnecting members 14, 16 are shaped and/or dimensioned such as to act as torsion springs which act to bias the oscillator arm 6 towards an equilibrium reference position. In effect the interconnecting or biasing members 14, 16 provide the spring constant of the vibration or oscillation of the oscillator arm 6. The oscillator arm itself acts as a sprung mass. In reality, of course, the oscillator arm 6 is not infinitely stiff and there maybe a small component of oscillation caused by the bending of the oscillator arm 6. The resonant or natural operating frequency of the system can be controlled by adjustment of the dimensions of the interconnecting or biasing means 14, 16. As the dimensions of the interconnecting or biasing means 14, 16 control, in the main, the spring constant of the vibration or oscillation of the system the design of a generator according to preferred forms of the present invention may be simplified and greater design freedom is provided. Since the interconnecting members 14, 16 function as torsional springs a well balanced vibration mode is created. This means that leakage of energy to the surroundings is reduced. The interconnecting members 14, 16 are not affected by inertial lateral forces in vibration. In this preferred embodiment the oscillator unit has an improved Quality or Q value and is more immune to changes in the surrounding environment thus stability is improved. In preferred embodiments of the invention utilising interconnecting members 14, 16 functioning as torsional springs as herein described the oscillation of the oscillator arm are in a direction out of the plane of the substrate 2. This is an easier mode of vibration to excite than one in which the vibration direction is in the plane of the substrate.

Preferred forms of the invention allow the elements 6 to be thin thereby enabling a thin substrate 2 to be utilised. This means that resonance frequencies involving motions perpendicular to the plane of the substrate 2 will be lower than corresponding modes involving motions in the plane of the substrate 2. The frequency spectrum will therefore be cleaner for the lower order modes perpendicular to the plane of the substrate 2 and these modes are therefore easier to excite, and they are also better defined due to the reduced manufacturing tolerance dependent risk of undesired coupling between the different vibration modes.

In preferred forms of the invention there is space at either end of the oscillator arm 6 for the mounting of the sensor(s) 20 and the driver(s) 18. Therefore the sensor(s) 20 and the driver(s) 18 can, if desired be larger and therefore more efficient. Both the sensors 20 and the drivers 18 are more efficient when they are positioned at or near the distal ends of the oscillator arm 6. Preferred forms of the present invention provide scope for such positioning.

The constant voltage supply 5 is connected to the oscillator arm 6 such as to maintain the oscillator arm 6 at a constant potential, which voltage, as will be described hereinbelow, in part regulates the oscillation of the oscillator arm 6.

The clock signal generator further comprises a driver 18 for deflecting the oscillator arm 6 about the axis defined by the interconnecting members 14, 16 of the mounting 8. In this embodiment the driver 18 comprises a conductive layer 19 which is disposed above the upper surface of the substrate 2 immediately below, but in spaced relation to, one end section 6a of the oscillator arm 6. The conductive layer 19 and the one end section 6a of the oscillator arm 6 together define a capacitor such that an electrostatic force is generated therebetween on applying a voltage to the conductive layer 19; the oscillator arm 6 being at a constant potential. This electrostatic force is proportional, in a first approximation, to the square of the difference in the voltages applied to the oscillator arm 6 and the conductive layer 19, with the electrostatic force being such as to drive the one end section 6a of the oscillator arm 6 either towards, that is, downwards, or away from, that is upwards, relative to the conductive layer 19 against the restoring bias, for example spring force, of the interconnecting members 14, 16 of the mounting 8.

The clock signal generator further comprises a sensor 20 for sensing the movement of the oscillator arm 6. In this embodiment the sensor 20 comprises a MOS transistor 21 which in the known manner comprises a source 22, a drain 24 and a gate 26, the gate 26 of which transistor 21 is disposed above the surface of the substrate 2 immediately below, but in spaced relation to, the other end section 6b of the oscillator arm 6 such as to define a resonant double-gate transistor which conducts current in accordance with the spacing between the other end section 6b of the oscillator arm 6 and the gate 26 of the transistor 21. The gate 26 of the transistor 21 is connected to a high resistive biasing circuit so as to provide a stable direct current operating point for the transistor 21.

The clock signal generator further comprises loop circuitry 28, which is connected between the conductive layer 19 of the driver 18 and the transistor 21 of the sensor 20. The loop circuitry 28 comprises a voltage and current supply 30 which is configured to provide a high resistive biasing on the gate 26 of the transistor 21 and act as a current supply to the source 22 and the drain 24 of the transistor 21. The loop circuitry 28 further comprises a signal amplifier 32 which receives the output of the transistor 21 and a signal phase adjuster 34 which receives the output of the signal amplifier 32 and provides a voltage signal of the correct phase and magnitude to the conductive layer 19 to maintain the oscillation of the oscillator arm 6 at the natural oscillating frequency thereof.

In one mode of operation the voltage applied to the oscillator arm 6 is changed such as to increase the voltage difference between the conductive layer 19 of the driver 18 and the voltage applied to the conductive layer 19 such as to attract the one end section 6*a* of the oscillator arm 6 and cause the rotation of the oscillator arm 6 around the interconnecting members 14, 16. This rotation of the oscillator arm 6 causes the other end section 6*b* of the oscillator arm 6 to be moved away from the gate 26 of the transistor 21, which movement is such as to decrease the output current of the transistor 21. This decrease in the output current of the transistor 21 is effective through the signal amplifier 32 and the signal phase adjuster 34 to decrease the voltage applied to the conductive layer 19 and allow the one end section 6*a* of the oscillator arm 6 to be driven away from the conductive layer 19 under the restoring bias of the interconnecting members 14, 16 of the mounting 8 such as to cause the rotation of the oscillator arm 6 in the opposite sense. This reverse rotation of the oscillator arm 6 causes the other end section 6*b* of the oscillator arm 6 to be driven towards the gate 26 of the transistor 21, which rotation is such as to increase the output current of the transistor 21. This increase in the output current of the transistor 21 is effective through the signal amplifier 32 and the signal phase adjuster 34 to increase the voltage applied to conductive layer 19 and once more attract the one end section 6*a* of the oscillator arm 6 and cause the rotation of the oscillator arm 6 in the one sense. When the loop parameters are choosen properly, this mechanical self-oscillation continues at a frequency corresponding to the natural vibration frequency of the oscillator arm 6 about the mounting 8. The natural vibration frequency of the oscillator arm 6 being tuned by the shape and/or dimension thereof and the restoring bias of the interconnecting members 14, 16. The variation in the current in the loop circuitry 28 has a frequency determined by the oscillation frequency of the oscillator arm 6 and this frequency provides an electrical clock output signal 36 which is derived from the current flow between the transistor 21 and the signal amplifier 32.

FIGS. 4(*a*) to (*k*) illustrate a method of manufacturing the clock signal generator of the first embodiment of the present invention. In a first step a silicon substrate 2 is doped to define the source 22 and the drain 24 of a MOS transistor 21 (FIG. 4(*a*)). A first oxide layer 40, typically about 500 nm thick, is grown on the substrate 2 (FIG. 4(*b*)). By masking and etching techniques an opening 42 is provided in the first oxide layer 40 in which the gate 26 of the transistor 21 is to be formed (FIG. 4(*c*)). A second oxide layer 44, typically about 10 nm thick, is grown over the exposed surface of the structure, including in the opening 42 in the first oxide layer 40 (FIG. 4(*d*)). A first polysilicon layer 46 is deposited over the exposed surface of the structure, including in the opening 42 in the first oxide layer 40 (FIG. 4(*e*)). By masking and etching techniques the first polysilicon layer 46 is partially removed to leave polysilicon regions which define a conductive layer 19 and the gate 26 of the transistor 21 (FIG. 4(*f*)). A third oxide layer 48 is grown over the exposed surface of the structure, including the polysilicon regions which define the conductive layer 19 and the gate 26 of the transistor 21 (FIG. 4(*g*)). By masking and etching techniques laterally spaced openings 50, 50 are formed substantially centrally between the polysilicon regions which define the conductive layer 19 and the gate 26 of the transistor 21 so as to provide locations exposing the substrate 2 for first and second laterally spaced support members 10, 12 of the mounting 8 of an oscillator unit 4 (FIG. 4(*h*)). A second polysilicon layer 52 is deposited over the exposed surface of the structure so as to fill the laterally spaced openings 50, 50 and overlie the third oxide layer 48 which overlies the polysilicon regions which define the conductive layer 19 and the gate 26 of the transistor 21 (FIG. 4(*i*)). By masking and etching steps the second polysilicon layer 52 is partially removed to define the oscillator arm 6 and the mounting 8 of the oscillator unit 4 (FIG. 4(*j*)). In a final step the third oxide layer 48 is sacrificially etched so as to be removed from beneath the oscillator arm 6 of the oscillator unit 4 such as to allow for oscillation of the oscillator arm 6 (FIG. 4(*k*)).

FIG. 5 illustrates a clock signal generator in accordance with a second embodiment of the present invention. This clock signal generator is quite similar structurally and operates in the same manner as the clock signal generator of the first embodiment of the present invention. Hence, in order not to duplicate description unnecessarily, only the structural differences will be described. The clock signal generator of this embodiment differs from that of the first embodiment in further comprising a second sensor 54 for sensing the movement of the oscillator arm 6 and in that the loop circuitry 28 includes a differential circuit 56 for comparing the signals form the first and second sensors 20, 54 in order to increase the noise immunity of the first sensor 20. In this embodiment the second sensor 54, in the same manner as the first sensor 20, comprises a MOS transistor 58 which comprises a source 60, a drain 62 and a gate 64, the gate 64 of which transistor 58 is disposed above the surface of the substrate 2 immediately below, but in spaced relation to, the one end section 6*a* of the oscillator arm 6 such as to define a resonant double-gate transistor which conducts current in accordance with the spacing between the one end section 6*a* of the oscillator arm 6 and the gate 64 of the transistor 58. The gate 64 of the transistor 58 is connected to a high resistive biasing circuit so as to provide a stable direct current operating point for the transistor 58. In this embodiment the voltage and current supply 30 is configured to provide a high resistive biasing on the gate 64 of the transistor 58 and act as a current supply to the source 60 and the drain 62 of the transistor 58. In operation, the differential circuit 56 compares, eg subtracts, the signals from the first and second sensors 20, 54 so as to reduce fluctuations which are due to noise (statisical fluctuations of the signal) and thereby provide an output signal to the signal amplifier 32 which represents more accurately variations in current due to the oscillation of the oscillator arm 6.

FIG. 7 illustrates a clock signal generator in accordance with a third embodiment of the present invention. This clock signal generator is quite similar structurally and operates in the same manner as the clock signal generator of the first embodiment of the present invention. Hence, in order not to duplicate description unnecessarily, only the structural differences will be described. The clock signal generator of this embodiment differs from that of the first embodiment only in that the driver 18 comprises a doped conductive region 66 in the substrate 2.

FIGS. 8(*a*) to (*k*) illustrate a method of manufacturing the clock signal generator of the third embodiment of the present invention. In a first step a silicon substrate 2 is doped to define the source 22 and the drain 24 of a MOS transistor 21 and a conductive region 66 of a driver 18 (FIG. 8(*a*)). A first oxide layer 40, typically about 500 nm thick, is grown on the substrate 2 (FIG. 8(*b*)). By masking and etching techniques an opening 42 is provided in the first oxide layer 40 in which the gate 26 of the transistor 21 is to be formed (FIG. 8(*c*)). A second oxide layer 44, typically about 10 nm thick, is grown over the exposed surface of the structure, including in the opening 42 in the first oxide layer 40 (FIG. 8(*d*)). A first polysilicon layer 46 is deposited over the exposed surface of the structure, including in the opening 42 in the first oxide layer 40 (FIG. 8(*e*)). By masking and etching techniques the first polysilicon layer 46 is partially removed to leave a polysilicon region which defines the gate 26 of the transistor 21 (FIG. 8(f)). A third oxide layer 48 is grown over the exposed surface of the structure, including the polysilicon region which defines the gate 26 of the transistor 21 and the conductive region 66 in the substrate 2 (FIG. 8(g)). By masking and etching techniques laterally spaced openings 50, 50 are formed substantially centrally between the polysilicon region which defines the gate 26 of the transistor 21 and the conductive region 66 in the substrate 2 so as to provide locations exposing the substrate 2 for first and second laterally spaced support members 10, 12 of the mounting 8 of an oscillator unit 4 (FIG. 8(h)). A second polysilicon layer 52 is deposited over the exposed surface of the structure so as to fill the laterally spaced openings 50, 50 and overlie the third oxide layer 48 which overlies the polysilicon region which defines the gate 26 of the transistor 21 and the conductive region 66 in the substrate 2 (FIG. 8(i)). By masking and etching steps the second polysilicon layer 52 is partially removed to define the oscillator arm 6 and the mounting 8 of the oscillator unit 4 (FIG. 8(j)). In a final step the third oxide layer 48 is sacrificially etched so as to be removed from beneath the oscillator arm 6 of the oscillator unit 4 such as to allow for oscillation of the oscillator arm 6 (FIG. 8(k)).

Finally, it will be understood that the present invention is described in its preferred embodiments and can be modified in many different ways without departing from the scope of the appended claims. For example, the clock signal generator of the second embodiment of the present invention could be modified to include a driver 18 of the kind incorporated in the third embodiment of the present invention.

What is claimed is:

1. A clock signal generator in an integrated circuit semiconductor device, comprising:
   a semiconductor substrate;
   an oscillator unit which comprises at least one support member which is fixed relative to the substrate, an oscillator arm which is oscillatably disposed to the at least one support member with regard a reference position, which oscillator arm includes first and second conductive sections at positions extended from the at least one support member and at least one biasing element for biasing the oscillator arm towards the reference position;
   a driver which is disposed at the substrate in spaced relation adjacent one of the conductive sections of the oscillator arm, which driver is configured in use to drive the one of the conductive sections of the oscillator arm towards or away therefrom when an electrical signal is applied thereto;
   a sensor which is disposed at the substrate in spaced relation adjacent the other of the conductive sections of the oscillator arm, which sensor is configured in use to generate an electrical signal dependent upon the spacing of the other of the conductive sections of the oscillator arm therefrom;
   loop circuitry which in use receives the variable electrical signal Generated by the sensor and in response thereto applies an electrical signal to the driver so as to cause oscillation of the oscillator arm at the natural oscillating frequency of the oscillator arm; and
   a clock signal output, which is responsive to the variation in the variable electrical signal, generated by the sensor so as to provide a clock signal, wherein the conductive sections of the oscillator arm are disposed on opposite sides of on e of at least one support member.

2. The clock signal generator according to claim 1, wherein the sensor comprises a transistor which is configured such that the conductivity thereof is dependent upon the position of the other of the conductive sections of the oscillator arm.

3. The clock signal generator according to claim 1, wherein the transistor is a MOS transistor which together with the other of the conductive sections of the oscillator arm defines a resonant double-gate transistor.

4. The clock signal generator according to claim 1, wherein the oscillator arm oscillates by means of the torsional motion of the biasing element.

5. The clock signal generator according to claim 4, wherein the driver comprises a conductive layer which is disposed above the substrate and together with the one of the conductive sections of the oscillator arm defines a capacitor.

6. The clock signal generator according to claim 5, wherein the conductive layer is formed of polysilicon.

7. The clock signal generator according to claim 1, wherein the driver comprises a conductive region in the substrate, which together with the one of the conductive sections of the oscillator arm defines a capacitor.

8. The clock signal generator according to claim 1, wherein one or both of the one and the other of the conductive sections of the oscillator arm is formed of polysilicon, metal or doped crystalline silicon.

9. The clock signal generator according to claim 1, wherein the oscillator arm is formed of polysilicon, metal or doped crystalline silicon.

10. The clock signal generator according to claim 1, wherein the oscillator unit is formed as a single integral unit.

11. The clock signal generator according to claim 1, wherein the oscillator arm is a substantially rigid member.

12. The clock signal general to according to claim 1, where arm is a generally planar member.

13. The clock signal general to according to claim 1, wherein the oscillator arm comprises an elongate member.

14. The clock signal generator according to claim 1, wherein the oscillator arm comprises an elongate member and wherein one of the one and the other of the conductive sections comprises one end of the oscillator arm.

15. The clock signal generator according to claim 14, where in the other of the one and the other of the conductive comprises the other end of the oscillator.

16. The clock signal generator according to claim 1, where circuitry includes a signal amplifier.

17. The clock signal generator according to claim 1, where circuitry includes a signal phase adjuster.

18. The clock signal generator according to claim 1, further comprising further sensor which is disposed in spaced relation adjacent the one conductive sections of the oscillator, which further sensor is configured in use to generate an electrical signal dependent upon the one of the conductive section s of the oscillator arm therefrom differential circuit which in use receives the variable electrical signals by the first and further sensors so as to detect differences in those signals and thereby reduce noise.

19. The clock signal generator according to claim 1, wherein the further sensor comprises a further transistor which is configured such that the conductivity thereof is dependent upon the position of the one of the conductive sections of the oscillator arm.

20. The clock signal generator according to claim 1, wherein the further transistor is a MOS transistor which together with the one of the conductive sections of the oscillator arm defines a resonant double-gate transistor.

* * * * *